US010242951B1

(12) United States Patent
Piper

(10) Patent No.: US 10,242,951 B1
(45) Date of Patent: Mar. 26, 2019

(54) OPTICAL ELECTRONIC-CHIP IDENTIFICATION WRITER USING DUMMY C4 BUMPS

(71) Applicant: International Business Machines Corporation, Armonk, NY (US)

(72) Inventor: Daniel Piper, Vancouver, WA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/827,063

(22) Filed: Nov. 30, 2017

(51) Int. Cl.
*H01L 23/00* (2006.01)
*H01L 23/544* (2006.01)
*H01L 21/78* (2006.01)

(52) U.S. Cl.
CPC ............ *H01L 23/544* (2013.01); *H01L 21/78* (2013.01); *H01L 24/11* (2013.01); *H01L 24/14* (2013.01); *H01L 24/94* (2013.01); *H01L 2223/54406* (2013.01); *H01L 2223/54433* (2013.01); *H01L 2223/54453* (2013.01); *H01L 2224/11462* (2013.01); *H01L 2224/11618* (2013.01); *H01L 2224/14163* (2013.01); *H01L 2224/14517* (2013.01)

(58) Field of Classification Search
CPC ......... H01L 23/544; H01L 2223/54406; H01L 2223/54433; H01L 2223/54453
USPC .......................................... 257/737; 438/613
See application file for complete search history.

(56) References Cited

U.S. PATENT DOCUMENTS

| 4,951,116 | A | 8/1990 | Kagawa et al. | |
|---|---|---|---|---|
| 5,585,662 | A | 12/1996 | Ogawa | |
| 6,291,110 | B1 | 9/2001 | Cooper et al. | |
| 6,400,037 | B1* | 6/2002 | Omizo | H01L 23/544 |
| | | | | 148/508 |
| 6,798,076 | B2* | 9/2004 | Horigan | H01L 23/544 |
| | | | | 257/738 |
| 7,170,299 | B1 | 1/2007 | Anand et al. | |
| 7,442,583 | B2 | 10/2008 | Bonaccio et al. | |
| 8,187,897 | B2 | 5/2012 | Cohn et al. | |
| 9,508,559 | B2 | 11/2016 | Saito et al. | |
| 2006/0283961 | A1* | 12/2006 | Misawa | H01L 23/544 |
| | | | | 235/492 |
| 2008/0057677 | A1* | 3/2008 | Charles | H01L 23/544 |
| | | | | 438/460 |
| 2008/0121709 | A1 | 5/2008 | Hayashi et al. | |

(Continued)

OTHER PUBLICATIONS

"Chip Identification Techniques," Disclosed Anonymously, IP.com, IPCOM000050565D, Feb. 10, 2005, 2 pages.

*Primary Examiner* — David Vu
*Assistant Examiner* — Brandon Fox
(74) *Attorney, Agent, or Firm* — Cantor Colburn LLP; Steven Myers

(57) ABSTRACT

Embodiments of the invention are directed to a method and resulting structures for forming optically readable chip identification (CID) codes using dummy controlled collapse chip connection (C4) bumps. In a non-limiting embodiment of the invention, a product chip is formed on a wafer. A chip location identifier including a plurality of controlled collapse chip connection (C4) bumps is formed on a surface of the product chip. The chip location identifier encodes a unique location of the product chip on the wafer prior to dicing. The plurality of C4 bumps are arranged into one or more optically readable alphanumeric characters.

18 Claims, 12 Drawing Sheets

(56) References Cited

U.S. PATENT DOCUMENTS

| | | | |
|---|---|---|---|
| 2009/0064078 A1* | 3/2009 | Kimura | G06F 17/5077 716/119 |
| 2009/0261463 A1 | 10/2009 | Chen et al. | |
| 2010/0044858 A1* | 2/2010 | Cohn | H01L 21/76807 257/734 |
| 2017/0193649 A1 | 7/2017 | Gao et al. | |

* cited by examiner

OPTICAL ELECTRONIC-CHIP IDENTIFICATION WRITER USING DUMMY C4 BUMPS

BACKGROUND

The present invention generally relates to integrated circuit (IC) chip location identification. More specifically, the present invention relates to an optically readable chip identification (CID) writer using dummy controlled collapse chip connection (C4) bumps.

During semiconductor device fabrication a large number of IC chips are concurrently formed on wafer substrates. IC chips are typically much smaller than a single wafer, and consequently, tens of thousands of chips can be fabricated using a single wafer. The actual number of IC chips yielded from a single wafer is a function of the wafer size and the individual chip size. Wafer manufacturers typically mark bare wafers with a unique code or identifier using, e.g, laser impingement. This identification code, typically located on the wafer edge, is unique to each wafer and can be human-readable, machine-readable, or both.

The wafers are then diced into individual IC chips. Once wafers are diced, the IC chips are picked and assembled into chip packages. At this point, it is not easy to determine exactly where on a wafer a particular IC chip originated. Determining the original wafer location of an IC chip is known as chip location identification. There are several reasons why it is desirable to have chip location identification traceability. For example, such information is useful for process learning so that defects can be corrected, product dispositioning for known defects, qualification learning, and engineering evaluation support (e.g., 'wafer striping').

SUMMARY

Embodiments of the present invention are directed to a method for forming optically readable chip identification (CID) codes using dummy controlled collapse chip connection (C4) bumps. A non-limiting example of the method includes forming a product chip on a wafer. A chip location identifier including a plurality of controlled collapse chip connection (C4) bumps is formed on a surface of the product chip. The chip location identifier encodes a unique location of the product chip on the wafer prior to dicing. The plurality of C4 bumps are arranged into one or more optically readable alphanumeric characters.

Embodiments of the present invention are directed to a method for encoding a chip location identifier onto a surface of an integrated circuit (IC) chip. A non-limiting example of the method includes forming the IC chip on a wafer. A photoresist layer is formed over the surface of the IC chip. The photoresist layer is patterned to expose one or more portions of the IC chip. The exposed portions are arranged to form a hexadecimal code that encodes chip location identification data. A C4 bump is formed on each exposed portion of the IC chip.

Embodiments of the invention are directed to a semiconductor device. A non-limiting example of the semiconductor device includes an IC chip. A chip location identifier including a plurality of C4 bumps is formed on a surface of the IC chip. The chip location identifier encodes a unique location of the IC chip on a wafer prior to dicing. The plurality of C4 bumps are arranged into one or more alphanumeric characters.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
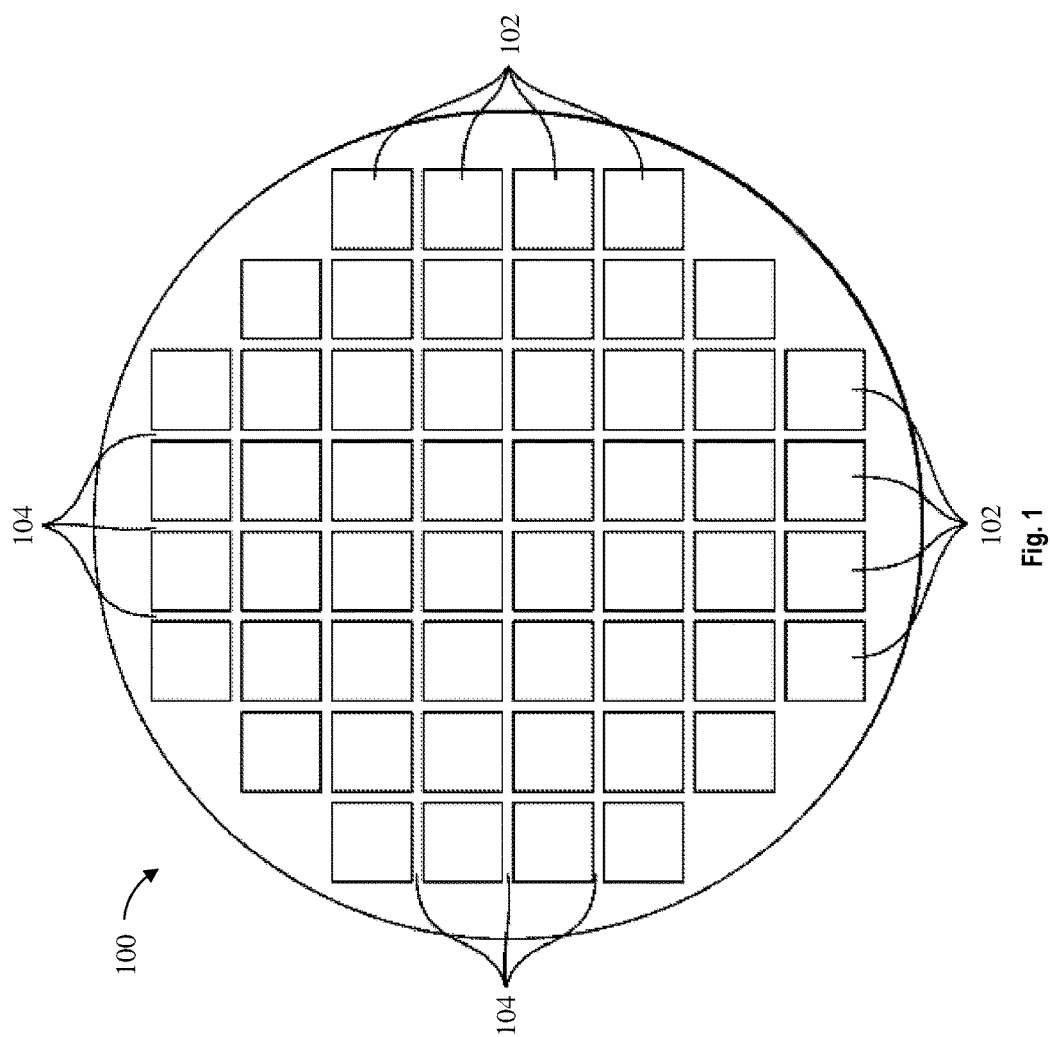
FIG. 1 depicts a top-down view of a wafer during an intermediate operation of a method of fabricating a semiconductor device according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, once a wafer is diced, it is not easy to determine exactly where on the wafer a particular IC chip originated. Chip location identification data ideally includes a unique wafer ID as well as a unique set of chip coordinates (i.e., X and Y coordinates uniquely locating the chip on the wafer surface). Solving chip location identification is an industry challenge having a variety of potential solutions. One conventional approach to provide chip location identification employs laser fuses. This approach, however, requires additional fuse blows to implement and a package tester for read-out. In addition, the use of laser fuses is not qualified for new, low dielectric constant technologies. Another approach involves the use of laser scribing to create a wafer-level chip identification nanoimprint. Laser scribing, however, creates mechanical damage and stress concentrations. Consequently, laser scribing is not qualified for some architectures (i.e., flip chip plastic ball grid array (FC-PBGA)), and cannot be read after packaging since typically the back side of the IC chip is covered.

Other approaches employ electronic-chip identification (i.e., e-fuse ID or ECID). Conventional ECID-based approaches, however, require additional chip design steps, a wafer test to blow fuses, a poly conductor mask (which cannot be used for CPI/packaging test sites) and require a package tester for electrical read-out. Electrical read-out of a chip's ECID post die-sort-pick (DSP) is itself challenging. For example, attempting to employ guardband specification relief for a wafer final test (WFT) that includes previously failing circuit-limited yield (CLY) chips as "good" requires that the die stock failing chips be packaged into mods to read the ECID. The ECID must then be matched to the WFT CLY data to determine if the chip can pass. There is always waste involved with this type of testing due to chip yield (i.e., each batch includes some percentage of chips that will fail).

Turning now to an overview of aspects of the present invention, one or more embodiments of the invention provide an optically readable CID using dummy controlled collapse chip connection (C4) bumps. A "dummy" C4 bump refers to a solder ball or bump that is electrically inactive at the module packaging stage. To provide an optically readable CID, the dummy C4 bumps are arranged into a hexadecimal pattern on a surface of a product chip. The hexadecimal pattern includes one or more optically readable characters which combine to encode chip location identification data. The chip location identification data identifies a unique location of the product chip on a wafer prior to dicing. Advantageously, an optically readable CID avoids the waste associated with electrical ECID (e.g., this approach does not require module builds to read), directly saving costs. In other words, this CID can be optically read post-dicing where the chip's waferID, chipX, and chipY information would be otherwise unknown without requiring mod packages or electrical ECID read-out. Moreover, this optically readable CID can be easily inserted into a conventional fabrication process flow by plating the dummy C4 bumps at the same time as the active C4 bumps.

Turning now to a more detailed description of aspects of the present invention, FIG. 1 depicts a top-down view of a wafer 100 during an intermediate operation of a method of fabricating a semiconductor device according to one or more embodiments of the present invention. As depicted, the wafer 100 has been processed by front-end-of-line processes to fabricate a plurality of substantially identical product chips 102, also known as integrated circuit (IC) chips. Each product chip 102 includes one or more integrated circuits that contain device structures. In some embodiments of the present invention, the product chips 102 are arranged in an array of rows and columns within the outer periphery of the wafer 100. It is understood, however, that the product chips 102 can be arranged in any fashion.

The number of product chips 102 can range from tens of chips to up to tens of thousands of chips on a single wafer 100. Among other factors, the actual number of product chips 102 yielded from wafer 100 is a function of the individual chip size, as well as the wafer size. In some embodiments of the present invention, the product chips 102 are ASIC chips fabricated on the order of about 500 chips per wafer. As depicted, each of the product chips 102 has the same size (i.e., length and width). In some embodiments of the present invention, one or more of the product chips 102 has a dissimilar size. Scribe-line channels 104 are present between adjacent pairs of product chips 102 in the array. The scribe-line channels 104 are free of device structures of the integrated circuit, but can contain test devices used to evaluate post-fabrication circuit quality. While only a single wafer is depicted, typical fabrication processes yield a plurality of wafers from a single lot, each having disposed thereon a plurality of product chips. In some embodiments of the present invention, a single fabrication run generates a "lot" of about 25 wafers.

The wafer 100 can be any suitable substrate containing a semiconductor material for forming an integrated circuit. For example, the wafer 100 can be composed of a monocrystalline silicon-containing material, such as bulk or SOI single crystal silicon. In other embodiments of the present invention, the wafer 100 includes SiGe, SiC, III-V compound semiconductor, II-VI compound semiconductor, or semiconductor-on-insulator (SOI). In some embodiments of the invention, the substrate includes a buried oxide layer (not depicted). In some embodiments of the present invention, the semiconductor material constituting wafer 100 can be lightly doped with an impurity to alter its electrical properties. Specifically, the wafer 100 can be doped with an n-type impurity (e.g., phosphorus or arsenic) to render it initially n-type or can be doped with a p-type impurity (e.g., Ga, B, $BF_2$, or Al) to render it initially p-type. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$. Standard round wafer sizes for wafer 100 range from a diameter of about 100 mm to a diameter of 300 mm, although other wafer sizes are within the contemplated scope of the invention.

Figure 2:
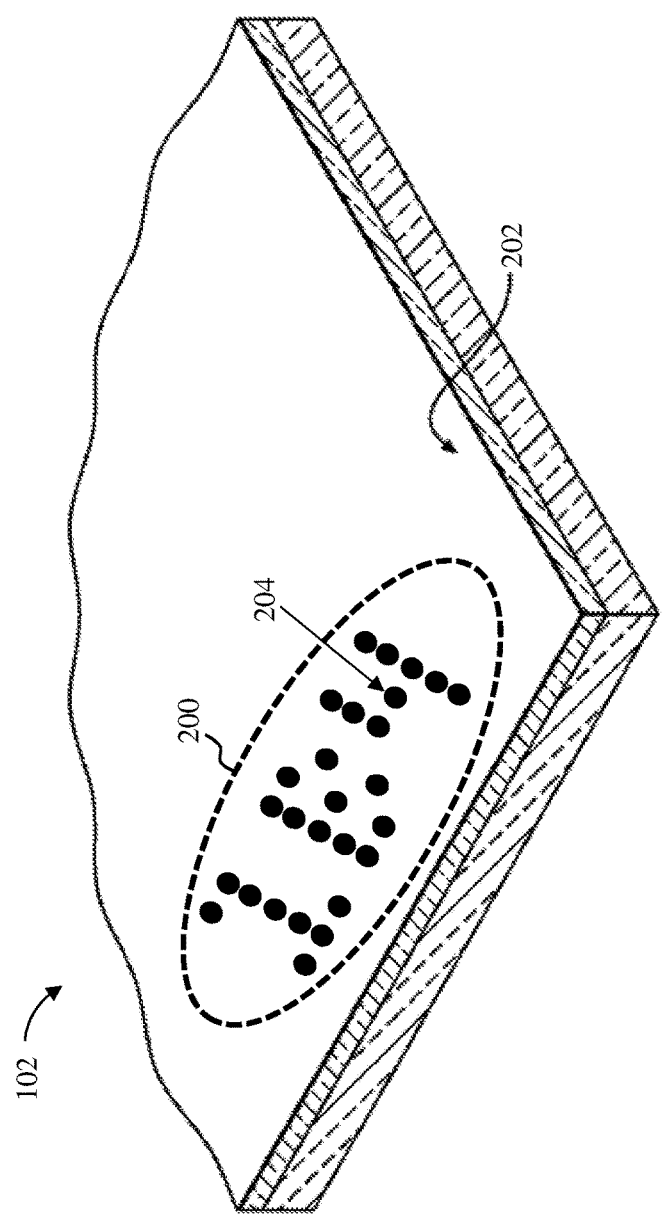
FIG. 2 depicts an isometric view of a portion of a single product chip during an intermediate operation of a method of fabricating a semiconductor device according to one or more embodiments of the invention.

FIG. 2 depicts an isometric view of a portion of a single product chip 102 during an intermediate operation of a method of fabricating a semiconductor device according to one or more embodiments of the invention. An optically readable CID hexcode 200 is formed on a surface 202 of the product chip 102. As will be discussed in further detail herein, the CID hexcode 200 is formed using a pattern of dummy C4 bumps 204. As depicted, the CID hexcode 200 encodes the three digit hexadecimal (hex based 16) code "1B4." It is understood that the CID hexcode can include any number of digits depending on the number of unique identifiers required by a given application. A four digit hexadecimal code provides 65,536 unique identifiers. A five digit hexadecimal code provides more than 1 million unique identifiers. In some embodiments of the present invention, the CID hexcode 200 is a single hexadecimal digit. In some embodiments of the present invention, the CID hexcode 200 is 2, 3, 4, 5, 6, or more than 6 hexadecimal digits. In some embodiments of the present invention, the CID hexcode 200 is instead a base 10 code. In still other embodiments of the present invention, the CID hexcode 200 is any other alphanumeric or numeric code (i.e., base 6, letters only, numbers only, binary, etc.).

Figure 3:
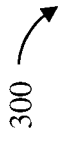
FIG. 3 depicts a partial view of a data structure having stored chip location identification data according to one or more embodiments of the invention.

The CID hexcode 200 encodes chip location identification data for the product chip 102 (as depicted in FIG. 3). In some embodiments of the present invention, this chip location identification data includes a unique wafer ID that identifies the parent wafer of the product chip 102 (i.e., the wafer 100 depicted in FIG. 1). In some embodiments of the present invention, this chip location identification data includes "X" and "Y" wafer coordinates that identify the location on the parent wafer surface where the product chip 102 originated. Forming the CID hexcode 200 from a pattern of C4 bumps 204 advantageously allows for the chip location identification data to be optically read using, for example, conventional automatic testing equipment (ATE) or an inspection microscope. In this manner, chip location identification data can be read without a mod package and without requiring an electrical ECID read.

As depicted, the CID hexcode 200 is formed in a corner region of the product chip 102. It is understood, however, that the CID hexcode 200 can be located in any region of the product chip 102. In some embodiments of the present invention, the CID hexcode 200 is located in an electrically inactive central or peripheral region of the product chip 102 (i.e., in a region devoid of device structures).

FIG. 3 depicts a partial view of a data structure 300 having stored chip location identification data according to one or more embodiments of the invention. As described previously herein, the CID hexcode 200 (depicted in FIG. 2) encodes chip location identification data for the product chip 102. For example, as depicted the CID hexcode 200 encodes the value "1B4." This hexcode is linked in the data structure 300 to the chip location identification data associated with that particular code. For example, as depicted the hexcode "1B4" encodes Lotid data "16254SC2001.000," Waferid data "65003QJ6SEA1," ChipX data "6," and ChipY data "5." In this manner, the chip location identification data for the product chip 102 can be easily obtained by optically reading the CID hexcode 200 on the product chip 102 and referring to the data structure 300. Once linked to the chip location identification data, the CID hexcode 200 can also be used to obtain any other chip-specific data, such as electrical measurements and test sort data. For example, during specification relief for WFT chip-specific electrical data can be retrieved using the CID hexcode 200 and compared against a modified specification to identify product chips that pass for packaging. While the data structure 300 is illustrated as a table, it is understood that the data structure 300 can be any lookup table, array, or any other suitable data structure.

In some embodiments of the present invention, chip location identification codes are sequentially assigned from the first chip written to the last chip written in a given lot. For example, the first chip encoded with a hexcode would have the value "000" in the data structure 300. In some embodiments of the present invention, the chip location identification codes are sequentially assigned but start at any arbitrary value. In some embodiments of the present invention, unique chip location identification codes are randomly assigned. As illustrated in the data structure 300, the chip location identification data can include a unique lot identifier, wafer identifier, Chip X identifier, and Chip Y identifier to provide the precise location on a specific wafer of a specific lot where the product chip 102 originated. It is understood that more or less information can be stored in the data structure 300, depending on the requirements of a given application. For example, lot and/or wafer identification do not need to be stored in the data structure 300 for applications having only a single lot or single wafer. In some embodiments of the present invention, the data structure 300 includes additional identifiers, such as, for example, time of fabrication identifiers, fabrication line identifiers, and employee identifiers. In this manner, any information associated with the product chip 102 can be stored in the data structure 300 for easy optical recall.

Figure 7:
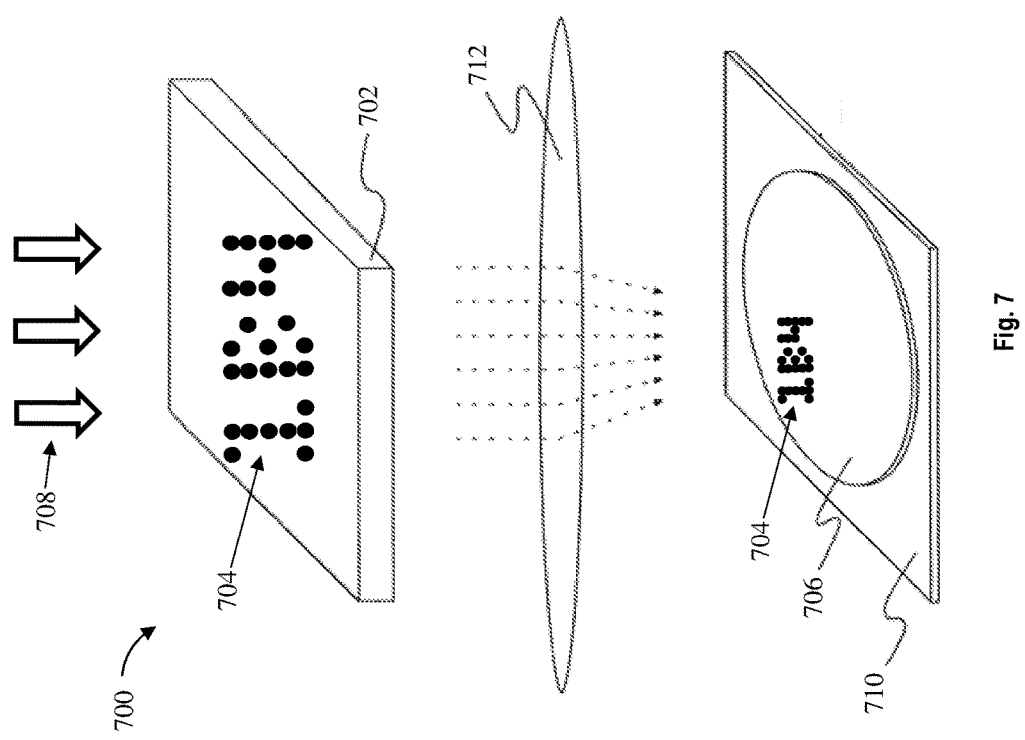
FIG. 7 depicts a system for forming optically readable CID hexcodes according to one or more embodiments of the invention.

The CID hexcode 200 for the product chip 102 can be linked to chip location identification data in the data structure 300 at various times throughout the fabrication process. In some embodiments of the present invention, the CID hexcode 200 is linked to the data structure 300 in situ at the time of hexcode writing. This approach is advantageous because the processing tool (e.g., the system 700 as depicted in FIG. 7) is provided with all of the necessary information: the hexcode data and wafer location data are required for generating the CID hexcode 200 on the correct product chip and the wafer ID itself can be optically read for recording. In some embodiments of the present invention, the CID hexcode 200 is linked to the data structure 300 post-processing. For example, the wafers can be processed using a metrology tool that optically reads the wafer ID and then successively scans through all of the product chips for their hexcodes for linking in the data structure 300. In some embodiments of the present invention, the CID hexcode 200 is linked to the data structure 300 pre-processing. For example, during the pre-fabrication planning phase a wafer ID sequence and the number and layout of all product chips on each wafer can be determined (e.g., at the step plan phase). The hexcodes for each product chip can then be linked to the data structure 300 and used by the processing tool to sequentially write hexcodes.

Figure 4:
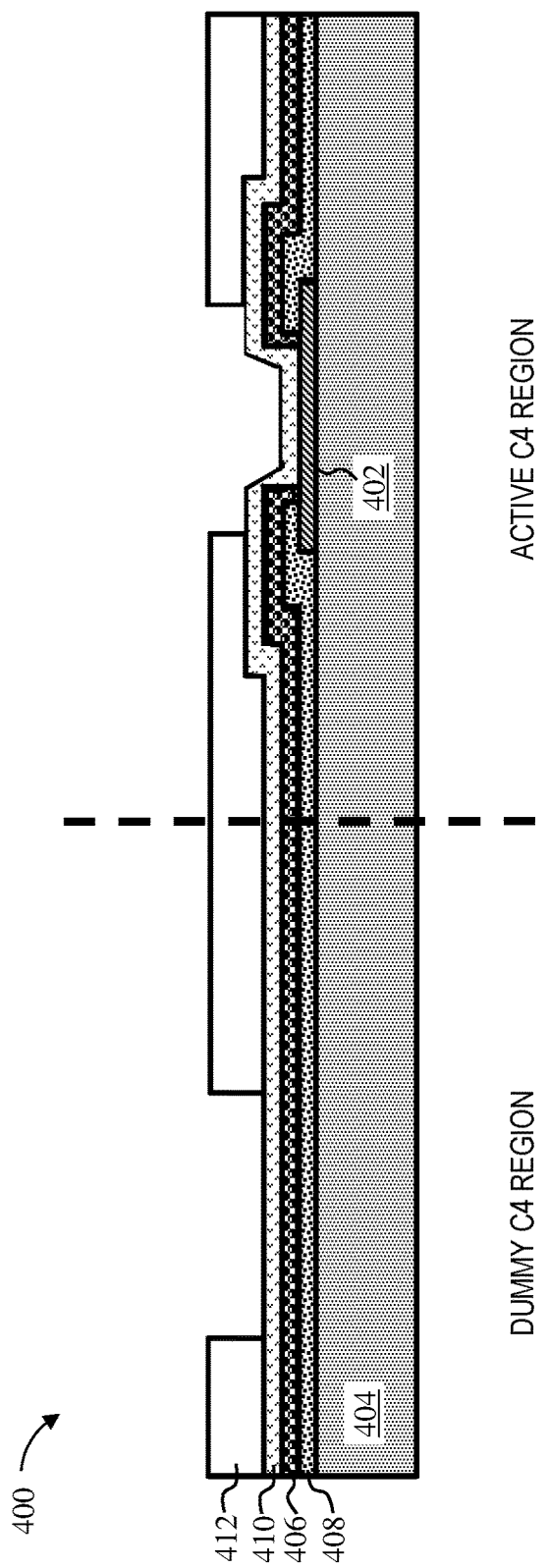
FIG. 4 depicts a cross-sectional view of a product chip during an intermediate operation of a method of fabricating a semiconductor device according to one or more embodiments of the invention.
Figure 5:
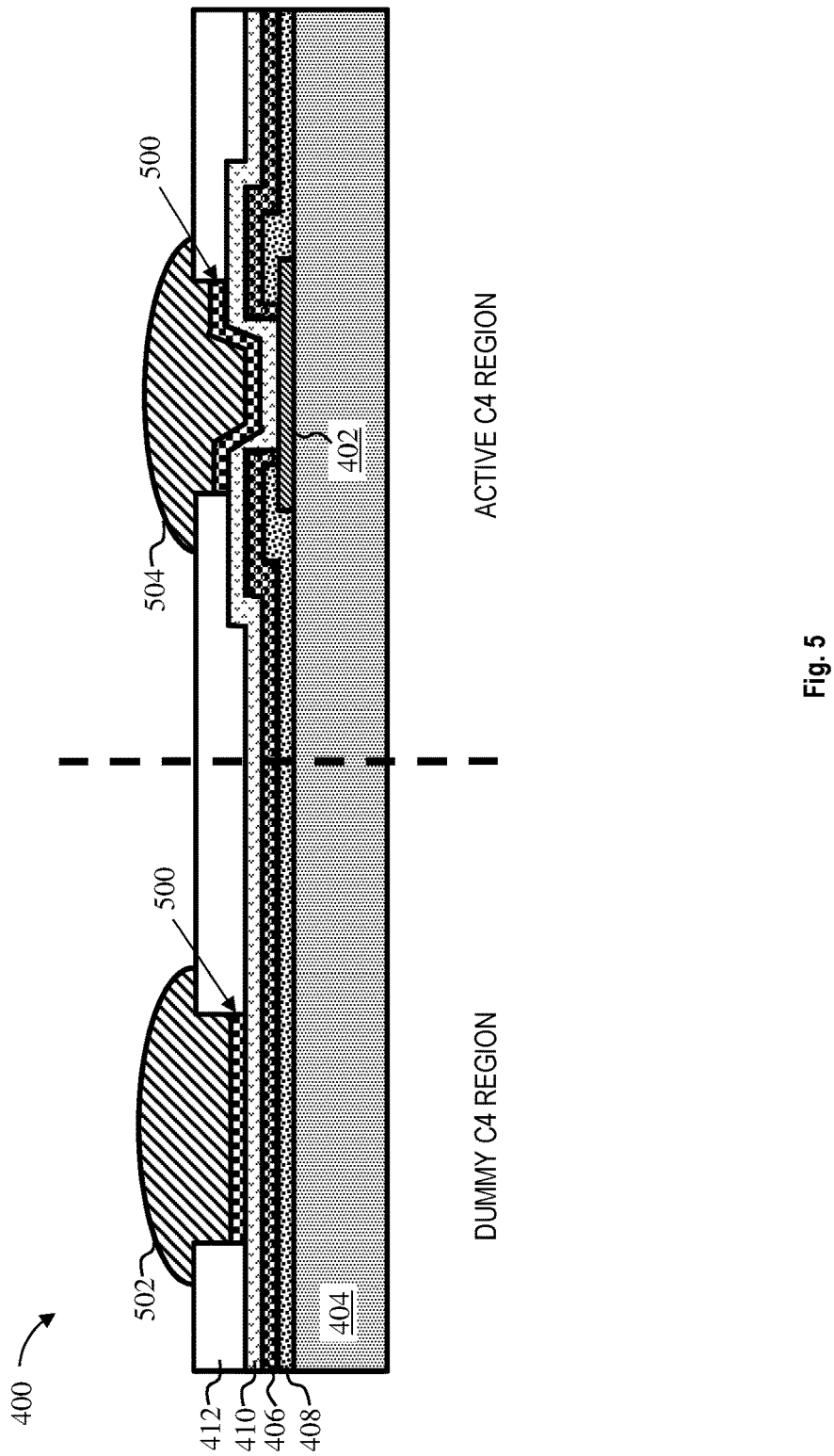
FIG. 5 depicts a cross-sectional view of the product chip depicted in FIG. 4 after under-bump-metallization (UBM) and bump plating during an intermediate operation of a method of fabricating a semiconductor device according to one or more embodiments of the invention.
Figure 6:
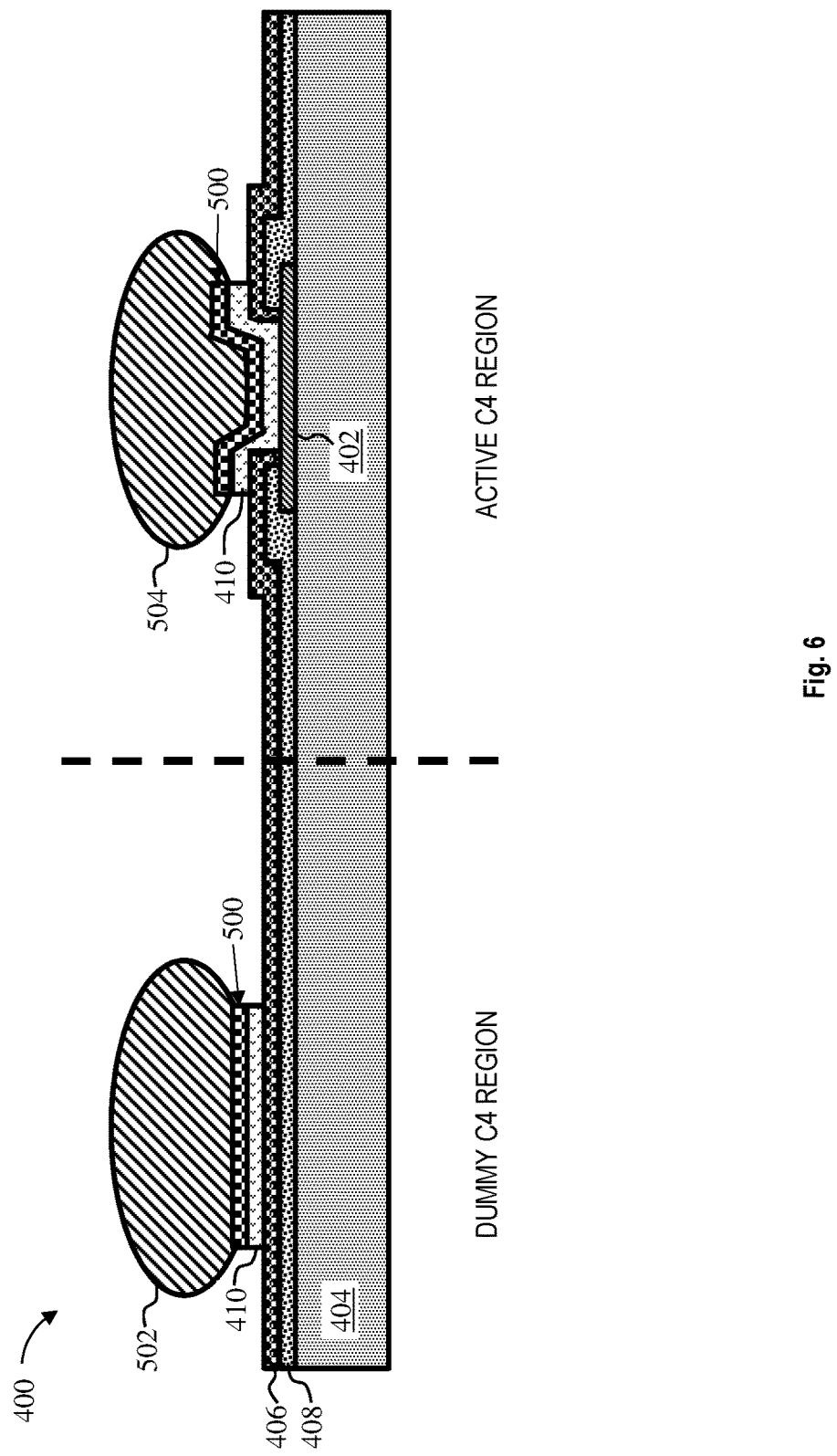
FIG. 6 depicts a cross-sectional view of the product chip depicted in FIG. 5 after a solder reflow during an intermediate operation of a method of fabricating a semiconductor device according to one or more embodiments of the invention.

FIGS. 4-6 depict successive cross-sectional views of a product chip 400 during an intermediate operation of a method of fabricating a semiconductor device according to one or more embodiments of the invention. With reference to FIG. 4, the product chip 400 includes a Dummy C4 Region and an Active C4 Region. These regions differ in that the Active C4 Region includes an electrical contact pad 402 formed over a portion of the substrate 404. The electrical contact pad 402 electrically couples the active C4 bump 504 (FIG. 6) to external devices (not depicted). The product chip 400 further includes a passivation layer 406 formed over portions of the substrate 404. In some embodiments of the present invention, a nitride layer 408 is formed between the passivation layer 406 and the substrate 404. In some embodiments of the present invention, a ball limiting metallurgy (BLM) layer 410 (also known as a metallization layer) is formed over the passivation layer 406 in the Dummy C4 Region and over the passivation layer 406 and the electrical contact pad 402 in the Active C4 Region. In the Active C4 Region, the passivation layer 406 and the nitride layer 408 are patterned such that the BLM layer 410 is in direct contact with a surface of the electrical contact pad 402.

The particular structure of the product chip 400 in the Dummy C4 Region and an Active C4 Region is provided for ease of discussion. It is understood, however, that the exact manner of forming C4 bumps is not meant to be particularly limited. The electrical contact pad 402 can be formed using any suitable process. The electrical contact pad 402 can include any electrically conductive material, such as, for example, an aluminum or copper alloy. The passivation layer 406 can be formed using known processes and typically includes a photosensitive polyimide (PSPI) layer. In some embodiments of the present invention, the passivation layer 406 is a PSPI layer having a thickness of about 3 microns. It should be understood, however, that any dielectric material that is capable of providing an electrical insulation layer can be used. The nitride layer 408 can include any suitable nitride, such as, for example, silicon nitride.

The BLM layer 410 can be any suitable single or multi-layer metallization layer, such as, for example, a titanium-copper bilayer. The BLM layer 410 serves two functions: providing an electrically conductive surface that facilitates the transfer of metal ions onto the substrate 404 surface during the solder bump electroplating process (FIG. 5) and acting as an adhesion layer between the electrical contact pad 402 and the active C4 bumps 504 (FIG. 5). Titanium is an excellent adhesion metal and adheres well with an aluminum contact pad. Copper is commonly used as a metal barrier layer and can be applied over the titanium layer to form the outer surface of the BLM. In some embodiments of the present invention, the BLM layer 410 is formed using one or more physical vapor deposition (PVD) processes.

As depicted in FIG. 4, a photoresist layer 412 is formed over the product chip 400. The photoresist layer 412 is patterned using known photolithographic processes to expose portions of the BLM layer 410. In some embodiments of the present invention, the photoresist layer 412 is patterned using known direct write laser exposure or programmable lithography processes. As depicted, the photoresist layer 412 is simultaneously patterned in both the Dummy and Active C4 Regions. This will result in the dummy C4 bumps 502 (FIG. 5) being plated simultaneously with the active C4 bumps 504. Alternatively, the Active C4 Region can be opened first and plated prior to opening the Dummy C4 Region.

The photoresist layer 412 can include any of the well known photosensitive resist materials known in the art. The photoresist layer 412 can be applied by any suitable process, such as, for example, spin coating or spraying. In some embodiments of the present invention, the photoresist layer 412 is a positive photoresist. A positive photoresist material is one which on exposure to imaging radiation, is capable of being rendered soluble in a solvent in which the unexposed resist is not soluble. In the Active C4 Region, the photoresist layer 412 is patterned (opened) over a portion of the electrical contact pad 402. In the Dummy C4 Region, the photoresist layer 412 is patterned (opened) over a portion of the BLM layer 410 corresponding to a desired location for a dummy C4 bump in an CID hexcode (e.g., the dummy C4 bumps 204 in the CID hexcode 200 depicted in FIG. 2).

FIG. 5 depicts a cross-sectional view of the product chip 400 after under-bump-metallization (UBM) and bump plating during an intermediate operation of a method of fabricating a semiconductor device according to one or more embodiments of the invention. Once the photoresist layer 412 is patterned, a UBM layer 500 is formed over the exposed portions of the BLM layer 410. The UBM layer 500 can include one or more layers. In some embodiments of the present invention, the UBM layer 500 includes a pedestal metallization stack (e.g., a TiW/Cu, Ti/Cu, or Ni/Cu/Ni/Cu/Solder stack) formed using known methods. In some embodiments of the present invention, the UBM layer 500 is formed using one or more dry PVD processes, although other deposition processes are within the contemplated scope of the invention.

After forming the UBM layer 500, dummy C4 bumps 502 and active C4 bumps 504 (also known as solder bumps) are formed in the Dummy C4 Region and Active C4 Region, respectively. In some embodiments, the dummy C4 bumps 502 and active C4 bumps 504 are formed using a lead-free solder such as, for example, SnAg. In some embodiments, the dummy C4 bumps 502 and active C4 bumps 504 are formed using a lead-free tin-based solder such as, for example, pure Sn, pure Sn followed by pure Ag, SnBi, SnAg, SnAgCu, or other known lead-free tin-based solders.

FIG. 6 depicts a cross-sectional view of the product chip 400 after removing the photoresist layer 412 and patterning the BLM layer 410 during an intermediate operation of a method of fabricating a semiconductor device according to one or more embodiments of the invention. The photoresist layer 412 can be removed using any known photoresist process, for example, stripping. Removing the photoresist layer 412 exposes portions of the BLM layer 410. The exposed portions of the BLM layer 410 are then removed using a wet etch, a dry etch, or a combination thereof. In some embodiments of the present invention, the BLM layer 410 is patterned using RIE. In some embodiments of the present invention, the BLM layer 410 is patterned selectively to the passivation layer 406 and/or the UBM layer 500. In some embodiments of the present invention, the dummy C4 bumps 502 and active C4 bumps 504 are reshaped using known solder reflow processes. As described previously herein, an electrical contact pad is not formed under the dummy C4 bumps 502 in the Dummy C4 Region. Consequently, the dummy C4 bumps 502 are electrically isolated (i.e., the dummy C4 bumps 502 are not electrically coupled to any external devices).

FIG. 7 depicts a system 700 for forming optically readable CID hexcodes according to one or more embodiments of the invention. The system 700 includes a photomask 702 that provides a template of a desired hexcode 704 (also known as a mask template). Advantageously, a single photoresist coat (e.g., a thin layer of photosensitive material) can be coated on a wafer 706 and used to concurrently or successively pattern both the active C4s and dummy C4s. For example, a first mask (not depicted) can be used for active C4 patterning and, subsequently and using the same resist, a direct write or additional programmable mask can be used to write the CID hexcode 704. The photoresist changes its chemical properties when impinged upon by light 708, and is used to translate or transfer the mask template onto a portion of the wafer 706. The wafer 706 is placed on a platform 710 for positioning beneath an optical system 712. In some embodiments of the present invention, the optical system 712 includes one or more lenses for projecting and demagnifying the image of the mask template onto the wafer 706. In some embodiments of the present invention, the mask template is a liquid crystal programmable mask. Known liquid crystal programmable masks can limit illumination to individual pixels in an arbitrary image to precisely control the transfer of a mask template to a wafer. In some embodiments of the present invention, a computer controls the illumination to individual pixels for defining the hexcode 704.

Figure 8:
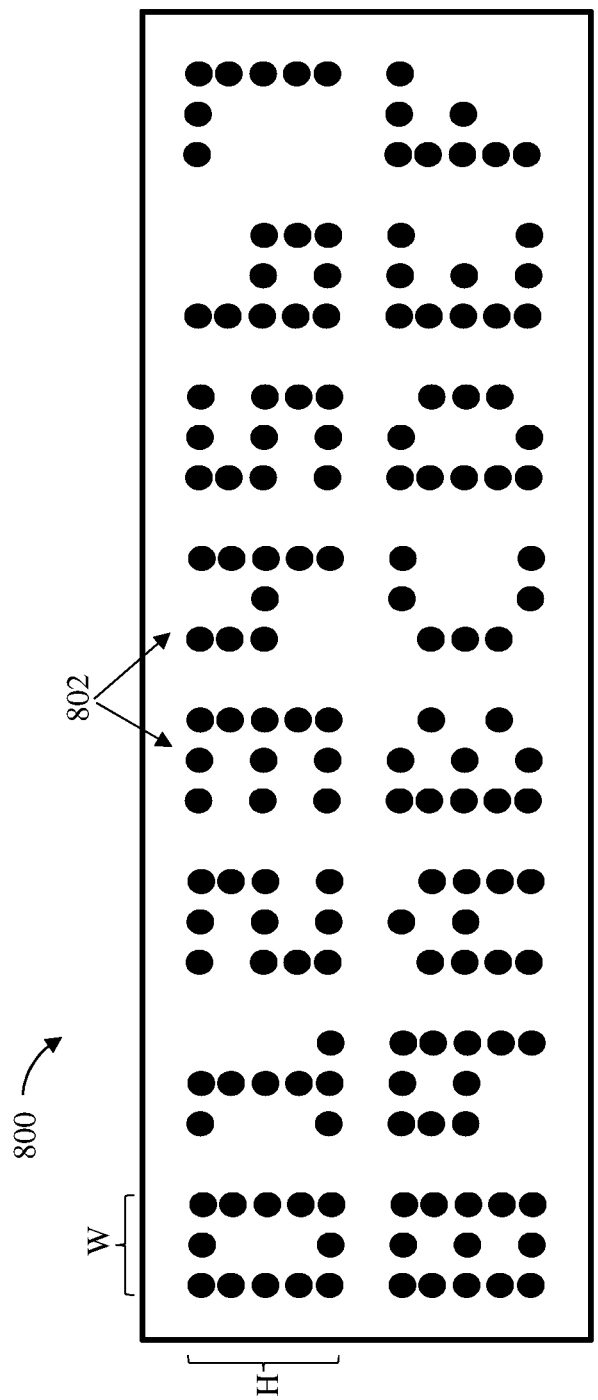
FIG. 8 depicts a set of possible C4 bump configurations for forming optically readable CID hexcodes according to one or more embodiments of the invention.

FIG. 8 depicts a set of possible C4 bump configurations 800 for forming optically readable CID hexcodes according to one or more embodiments of the invention. Each of the hexcode symbols 802 is formed from a unique arrangement of C4 bumps (i.e., a unique dot pattern). As depicted, the C4 bump pattern for each of the unique hexcode symbols 802 includes a width of three bumps and a height of five bumps. Alternatively, any suitable C4 bump pattern can be used, so long as each symbol can be uniquely depicted, and other pattern templates having different bump heights or widths are within the contemplated scope of the invention.

Figure 9:
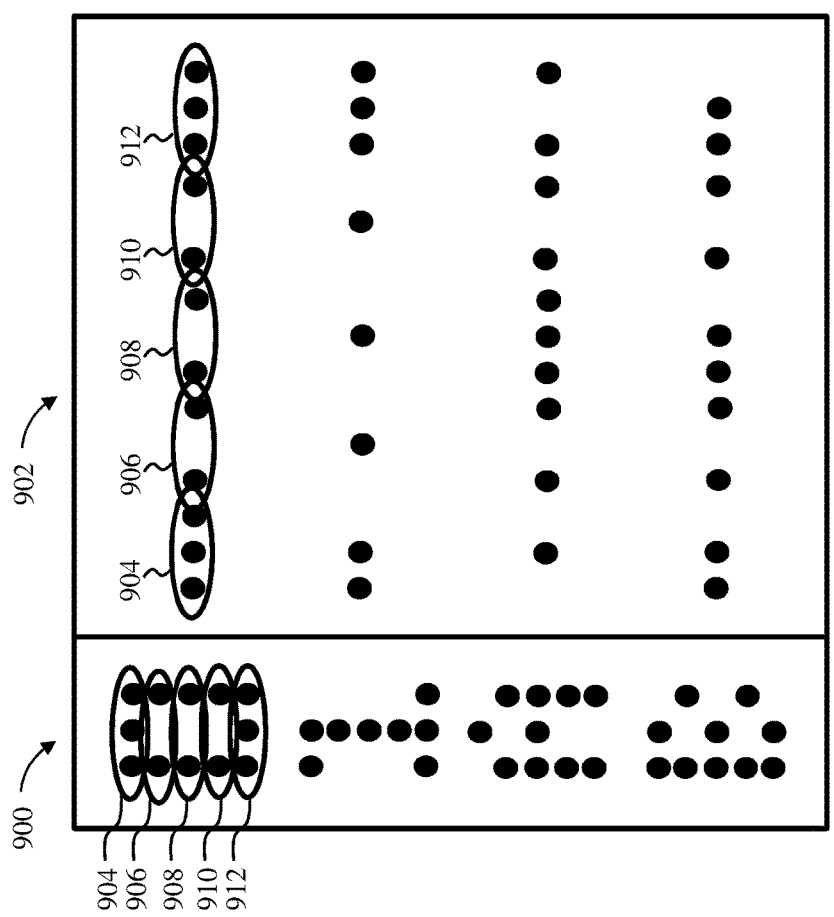
FIG. 9 depicts a system for translating a two-dimensional C4 bump configuration into a one-dimensional (1-high) bump configuration for forming optically readable CID hexcodes according to one or more embodiments of the invention.

FIG. 9 depicts a system for translating a two-dimensional C4 bump configuration 900 into a one-dimensional (1-high) bump configuration 902 for forming optically readable CID hexcodes according to one or more embodiments of the invention. As depicted, the two-dimensional C4 bump configuration 900 encodes the hexcode "01AB." Each digit of the two-dimensional C4 bump configuration 900 is divided into rows. For example, "0" is divided into rows 904, 906, 908, 910, and 912. The rows 904, 906, 908, 910, and 912 are then unstacked and sequentially arranged to form a portion of the 1-high bump configuration 902. A 1-high bump configuration 902 can be advantageous when chip area is limited but the perimeter is available.

Figure 10:
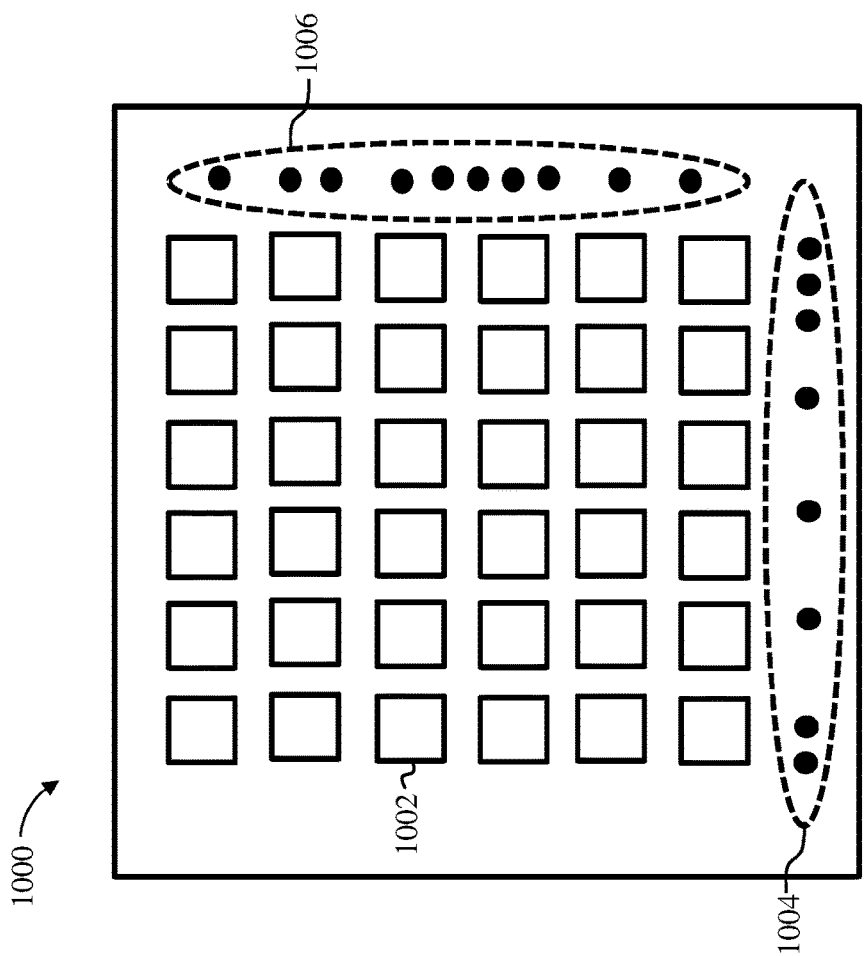
FIG. 10 depicts a product chip encoded with a 1-high optically readable hexcode according to one or more embodiments of the invention.

FIG. 10 depicts a product chip 1000 encoded with a 1-high optically readable hexcode according to one or more embodiments of the invention. The product chip 1000 includes a plurality of electrically active components 1002. As depicted, the interior area within the product chip 1000 is limited while the perimeter is relatively free. As discussed previously herein, a 1-high optically readable hexcode is well-suited to chip configurations having a limited interior area when sufficient perimeter space is available. Accordingly, a 1-high optically readable hexcode can be encoded into a ring around the perimeter of the product chip 1000. For example, a first digit 1004 of the 1-high optically readable hexcode encodes the value "1" (as depicted in FIG. 9) while a second digit 1006 of the 1-high optically readable hexcode encodes the value "A" (as depicted in FIG. 9). While depicted as a single ring (i.e., a single perimeter layer), in some embodiments of the present invention two or more nested rings of one or more 1-high optically readable hexcodes are formed around the perimeter of the product chip 1000.

Figure 11:
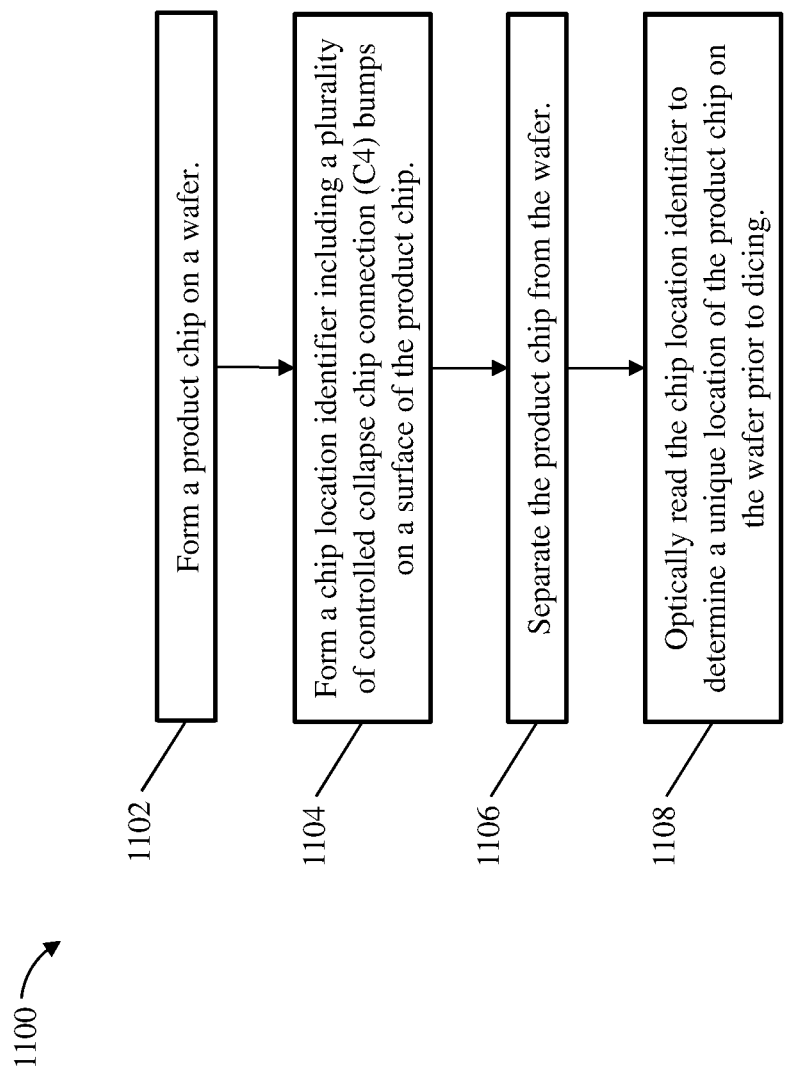
FIG. 11 depicts a flow diagram illustrating a method for forming a semiconductor device having an optically readable CID code according to one or more embodiments of the invention.

FIG. 11 depicts a flow diagram 1100 illustrating a method for forming a semiconductor device having an optically readable CID code according to one or more embodiments of the invention. As shown at block 1102, a product chip is formed on a wafer. At block 1104, a chip location identifier including a plurality of C4 bumps is formed on a surface of the product chip. The chip location identifier encodes a unique location of the product chip on the wafer prior to dicing. As discussed previously herein, the plurality of C4 bumps are arranged into one or more optically readable alphanumeric characters.

As shown at block 1106, the product chip is removed from the wafer in a process known as dicing. The product chip can be removed from the wafer prior to, or after, forming the chip location identifier. As shown at block 1108, the chip location identifier can be optically read post-dicing to determine the original, unique location of the product chip on the wafer.

Figure 12:
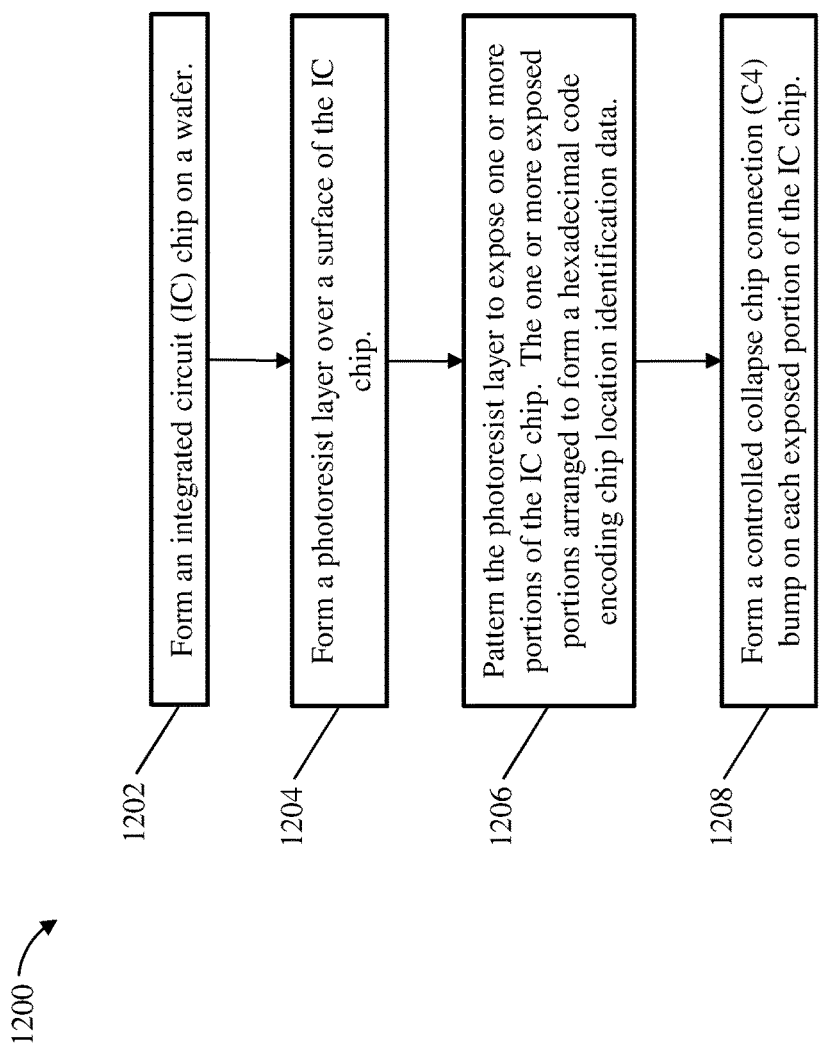
FIG. 12 depicts a flow diagram illustrating a method for encoding a chip location identifier onto a surface of an IC chip according to one or more embodiments of the invention.

FIG. 12 depicts a flow diagram 1200 illustrating a method for encoding a chip location identifier onto a surface of an IC chip according to one or more embodiments of the invention. As shown at block 1202, the IC chip is formed on a wafer. At block 1204, a photoresist layer is formed over the surface of the IC chip.

The method includes, at block 1206, patterning the photoresist layer to expose one or more portions of the IC chip. The one or more exposed portions are arranged to form a hexadecimal code that encodes chip location identification data according to one or more embodiments of the present invention.

At block 1208, a C4 bump is formed on each exposed portion of the IC chip. Each C4 bump can be a dummy C4 bump formed in a similar manner as the dummy C4 bumps 502 (depicted in FIGS. 4 and 5).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on the semiconductor surface, and can not deposit material on exposed surfaces, such as silicon dioxide or silicon nitride surfaces.

As previously noted herein, for the sake of brevity, conventional techniques related to a semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a product chip on a wafer; and
   forming a chip location identifier comprising a plurality of controlled collapse chip connection (C4) bumps on a surface of the product chip, the chip location identifier encoding a unique location of the product chip on the wafer prior to dicing;
   wherein the plurality of C4 bumps are arranged into one or more optically readable alphanumeric characters that comprise a hexadecimal code, wherein each hexadecimal digit is mapped to a unique dot pattern of C4 bumps.

2. The method of claim 1, wherein the hexadecimal code is a four or five digit hexadecimal code.

3. The method of claim 1, wherein each unique dot pattern comprises a three C4 bump wide by five C4 bump high grid.

4. The method of claim 1, wherein each unique dot pattern comprises a 1-dimensional C4 bump pattern.

5. The method of claim 1 further comprising dicing the wafer to detach the product chip.

6. The method of claim 1, wherein the plurality of C4 bumps are dummy C4 bumps.

7. The method of claim 1, wherein the alphanumeric characters comprise a base 10 code or a binary code.

8. The method of claim 1, wherein the chip location identifier is formed in a corner region of the product chip.

9. The method of claim 1, wherein the chip location identifier is formed in an electrically inactive central or peripheral region of the product chip.

10. A method for encoding a chip location identifier onto a surface of an integrated circuit (IC) chip, the method comprising:
    forming the IC chip on a wafer;
    forming a photoresist layer over the surface of the IC chip;
    patterning the photoresist layer to expose one or more portions of the IC chip, the one or more exposed portions arranged to form a hexadecimal code, the hexadecimal code encoding chip location identification data; and
    forming a controlled collapse chip connection (C4) bump on each exposed portion of the IC chip.

11. The method of claim 10, wherein the photoresist layer is patterned using a direct write laser exposure or programmable lithography.

12. The method of claim 10, wherein the chip location identification data comprises a unique location of the chip on the wafer prior to dicing.

13. The method of claim 10, wherein the chip location identification data is optically readable.

14. The method of claim 10 further comprising recording the chip location identification data in a data structure.

15. The method of claim 14, wherein the chip location identification data recorded in the data structure comprises a unique location of the IC chip on the wafer prior to dicing.

16. A semiconductor device comprising:
    an integrated circuit (IC) chip; and
    a chip location identifier comprising a plurality of controlled collapse chip connection (C4) bumps on a surface of the IC chip, the chip location identifier encoding a unique location of the IC chip on a wafer prior to dicing;
    wherein the plurality of C4 bumps are arranged into one or more alphanumeric characters that comprise a hexadecimal code, wherein each hexadecimal digit is mapped to a unique dot pattern of C4 bumps.

17. The semiconductor device of claim 16, wherein the alphanumeric characters comprise a hexadecimal code.

18. The semiconductor device of claim 17, wherein the hexadecimal code is a four or five digit hexadecimal code.

* * * * *